United States Patent
Huang et al.

(10) Patent No.: US 10,049,764 B2
(45) Date of Patent: Aug. 14, 2018

(54) CONTROL METHOD FOR MEMORY DEVICE AND MEMORY CONTROLLER

(71) Applicant: MACRONIX INTERNATIONAL CO., LTD., Hsinchu (TW)

(72) Inventors: Yu-Ming Huang, Taipei (TW); Hsiang-Pang Li, Zhubei (TW); Kun-Cheng Hsu, New Taipei (TW); Yuan-Hao Chang, Taipei (TW); Tei-Wei Kuo, New Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/614,654

(22) Filed: Jun. 6, 2017

(65) Prior Publication Data

US 2018/0166148 A1 Jun. 14, 2018

Related U.S. Application Data

(63) Continuation-in-part of application No. 15/376,715, filed on Dec. 13, 2016, now Pat. No. 9,823,961.

(51) Int. Cl.

| *G11C 16/06* | (2006.01) |
|---|---|
| *G11C 29/44* | (2006.01) |
| *G06F 11/27* | (2006.01) |
| *G11C 29/10* | (2006.01) |
| *G11C 29/12* | (2006.01) |

(52) U.S. Cl.
CPC .............. *G11C 29/44* (2013.01); *G06F 11/27* (2013.01); *G11C 29/10* (2013.01); *G11C 2029/1202* (2013.01)

(58) Field of Classification Search
CPC ............ G11C 11/5628; G11C 16/0483; G11C 2211/5641; G11C 29/56004; G11C 29/56008; G11C 7/1006; G11C 11/5642; G11C 17/146; G11C 2029/0411
USPC ........ 714/776, E11.032, 752, 807, 755, 773, 714/774, 780, 781; 365/185.03, 185.33, 365/185.09, 185.11, 185.17, 185.29, 365/185.12, 185.18, 185.24, 185.2, 365/185.21

See application file for complete search history.

(56) References Cited

U.S. PATENT DOCUMENTS

| 9,164,835 B2 | 10/2015 | Lee et al. |
|---|---|---|
| 9,239,778 B2 | 1/2016 | Lee et al. |

(Continued)

OTHER PUBLICATIONS

Li, et al.: "A Study of Polar Codes for MLC NAND Flash Memories"; 2015 International Conference on Computing, Networking and Communications, Invited Position Papers; pp. 1-5.

(Continued)

*Primary Examiner* — Thong Q Le
(74) *Attorney, Agent, or Firm* — McClure, Qualey & Rodack, LLP

(57) ABSTRACT

A control method for a memory device is provided. The control method includes the following steps. Convert multiple input bits on multiple bit-channels into a code word through a polar code transformation. Select a boundary bit-channel among the bit-channels according to a first ranking list for the bit-channels. Identify a target memory cell among the memory cells according to the boundary bit-channel and a generator matrix of the polar code transformation. Decrease a raw bit error rate of the target memory cell.

18 Claims, 7 Drawing Sheets

(56) References Cited

U.S. PATENT DOCUMENTS

| | | |
|---|---|---|
| 9,442,662 B2 | 9/2016 | Dancho et al. |
| 2009/0172247 A1 | 7/2009 | Bar-or et al. |
| 2013/0283128 A1 | 10/2013 | Lee et al. |
| 2015/0012795 A1 | 1/2015 | Sakaue |
| 2015/0248332 A1 | 9/2015 | Ordentlich et al. |
| 2015/0293716 A1* | 10/2015 | Jiang .................... H03M 13/13 711/154 |
| 2015/0309875 A1 | 10/2015 | Mittelholzer et al. |
| 2015/0333775 A1 | 11/2015 | Korb et al. |
| 2016/0162352 A1 | 6/2016 | Singhai et al. |
| 2016/0294418 A1 | 10/2016 | Huang et al. |

OTHER PUBLICATIONS

Sarkis, et al.: "Fast Polar Decoders: Algorithm and Implementation"; IEEE Journal on Selected Areas in Communications, vol. 32, No. 5, May 2014; pp. 946-957.

Wang, et al.: "Interleaved Concatenations of Polar Codes With BCH and Convolutional Codes"; IEEE Journal on Selected Areas in Communications, vol. 34, No. 2, Feb. 2016; pp. 267-277.

* cited by examiner

CONTROL METHOD FOR MEMORY DEVICE AND MEMORY CONTROLLER

This application is a continuation-in-part application of application Ser. No. 15/376,715, filed on Dec. 13, 2016, now U.S. Pat. No. 9,823,961, the contents of which are incorporated herein by reference.

TECHNICAL FIELD

The disclosure relates in general to a control method for a memory device and a memory controller.

BACKGROUND

There are several techniques for prolonging the effective lifetime of a storage media. For instance, an error-correcting code (ECC) can be used for each page or sector in order to correct errors. ECC encodes data in a way that a decoder can identify and correct errors in the data. For example, data are encoded by adding a number of redundant bits to them. When the data is reconstructed, the decoder examines the encoded message to correct any errors.

In order to simplify the design of ECC and to improve the error-correcting performance in most storage applications, the states of memory cells are usually assumed to be independent and identically distributed (i.i.d.). However, if the cell states vary with usage time, the error-correcting performance will degrade. In addition, the threshold voltage (Vt) distributions of storage media such as NAND flash memory are different for every single cell due to disturb, random telegraph noise, and charge leakage, and thus the i.i.d. property is not appropriate in real case, which leads to performance loss.

SUMMARY

One of the purposes of the present disclosure is to provide a memory controller and a control method thereof, utilizing proactive channel adjustment to arrange data to achieve an uneven and specific wear level distribution for the cells, thereby improving the error-correcting performance.

According to one embodiment, a control method for a memory device is provided. The control method includes the following steps. Convert multiple input bits on multiple bit-channels into a code word through a polar code transformation. Select a boundary bit-channel among the bit-channels according to a first ranking list for the bit-channels. Identify a target memory cell among the memory cells according to the boundary bit-channel and a generator matrix of the polar code transformation. Decrease a raw bit error rate of the target memory cell.

According to another embodiment, a memory controller is provided. The memory controller includes a polar encoder, a ranking unit, and a proactive channel adjustment unit. The polar encoder is configured to convert multiple input bits on multiple bit-channels into a code word through a polar code transformation, wherein the code word is written to multiple memory cells in the memory device. The ranking unit is configured to provide a first ranking list for the bit-channels. The proactive channel adjustment unit is configured to select a boundary bit-channel among the bit-channels according to the first ranking list, identify a target memory cell among the memory cells according to the boundary bit-channel and a generator matrix of the polar code transformation, and decrease a raw bit error rate of the target memory cell.

Figure 1:
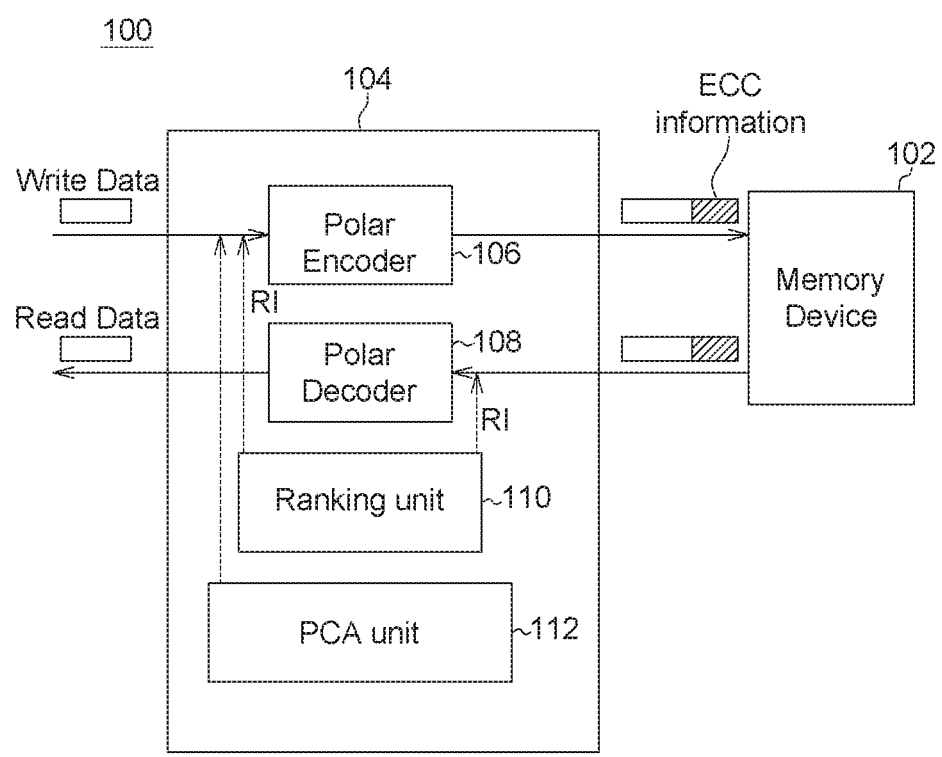
FIG. 1 shows an example block diagram of a memory system, in accordance with an embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

A number of embodiments are disclosed below for elaborating the disclosure. However, the embodiments of the disclosure are for detailed descriptions only, not for limiting the scope of protection of the disclosure. Furthermore, secondary or less relevant elements are omitted in the accompanying diagrams of the embodiments for highlighting the technical features of the disclosure.

FIG. 1 shows an example block diagram of a memory system 100, in accordance with an embodiment of the present disclosure. The memory system 100 includes a memory device 102 and a memory controller 104. The memory device 102 is, for example, a NAND flash memory. Other types of memory, such as NOR flash memory, phase change RAM (PRAM), Ferroelectric RAM (FRAM), magnetic RAM (MRAM) and/or Dynamic RAM (DRAM), may also be applicable for the memory device 102. The memory controller 104 may be implemented, for example, by using software running on one or more processors, hardware circuits (e.g., logic circuits), or the combination thereof.

The memory device 102 includes multiple memory cells for storing data. For example, a cell has a binary bit X as input and an output Y. In other words, we program a binary bit X to the cell, and we would like to read the binary bit X out when users need to know the value. In addition, for advanced error-correcting, the output value is a (log) likelihood ratio, which is a ratio of probability, instead of a binary bit. The "cell" can be deemed as a "channel" derived from simulated or measured error patterns between the input bit X and the output bit Y.

The memory controller 104 includes a polar encoder 106, a polar decoder 108, a ranking unit 110, and a proactive channel adjustment (PCA) unit 112. The polar encoder 106 encodes data with ECC information before written in the memory device 102. The polar decoder 108 decodes the ECC information of the data read from the memory device 102. The ranking unit 110 may be a hardware circuit such as a storage device. The PCA unit 112 may be a hardware circuit such as a processor or a microcontroller.

In one embodiment, the polar encoder 106 is configured to convert multiple input bits on multiple bit-channels into a code word through a polar code transformation. The code word is written to multiple memory cells in the memory device 102. The memory cells in the memory device 102 may be referred as channels, and the input terminals of the polar encoder 106 may be referred as bit-channels.

If a polar code has a sufficiently long code length N, the bit-channels, i.e., virtual channel realizations which include encoding, real channel, and decoding parts, seen by individual input bits through the polar code transformation may be polarized to either highly reliable or highly unreliable, which is known as channel polarization. This suggests the construction of polar codes as follows: put the information bits over the set of good bit-channels, i.e. almost noise-less channels, while put the frozen bits over the set of bad bit-channels, i.e. almost pure-noise channels.

Due to the property of channel polarization, the correction capability of polar code mainly depends on the ranking determined based on the states (for example, raw bit error rate) of the memory cells. Here, the order derived according to the reliability of bit-channels is referred to as "ranking", which is also known as "code construction".

The ranking unit 110 may provide a first ranking list R1 for the bit-channels to the polar encoder 106 and the polar decoder 108 to identify the positions of the information bits and the frozen bits in a polar code. As shown in FIG. 1, the polar encoder 106 may refer the ranking information in the first ranking list R1 to encode the write data, and the polar decoder 108 may refer the ranking information in the first ranking list R1 to decode the data read from the memory device 102.

Based on the property of polar code transformation, the ranking of the bit-channels might change with different states of the cells. For example, different usage rate or process variation between memory cells may result in different raw bit error rate in each memory cell, which leads to different rankings. This "channel-specific" property makes the ranking list change with time, and thus the positions of "information bits" and "frozen bits" in the polar code transformation change with time as well. Encoding with a ranking list that is not corresponding to the current cell states may degrade error-correcting performance.

To avoid using a degraded bit-channel to carry information bit and thus reducing the error-correcting performance, one solution is to maintain several rankings (also called "code constructions") in advance. For example, the ranking unit 110 may pre-store multiple ranking lists, and provide a specific ranking list for a certain number of P/E cycles. However, the hardware overhead for storing and switching multiple different rankings is relatively high.

According to the present disclosure, the PCA unit 112 is provided to address the abovementioned issues. The PCA unit 112 is configured to select a boundary bit-channel among the bit-channels according to the first ranking list R1, identify a target memory cell among the memory cells according to the boundary bit-channel and a generator matrix of the polar code transformation, and decrease a raw bit error rate of the target memory cell. For example, the PCA unit 112 may perform an uneven wear leveling scheme on the target memory cell to make a ranking of the bit-channels match only one code construction of polar code.

As such, the impact of cell wearing can be alleviated, such that the ranking of the bit-channels can be kept the same. In other words, there is no need for the ranking unit 110 to store multiple ranking lists. A single fixed ranking list R1 is sufficient for the error correction capability, thus effectively reducing the hardware overhead.

Figures 2A, 2B:
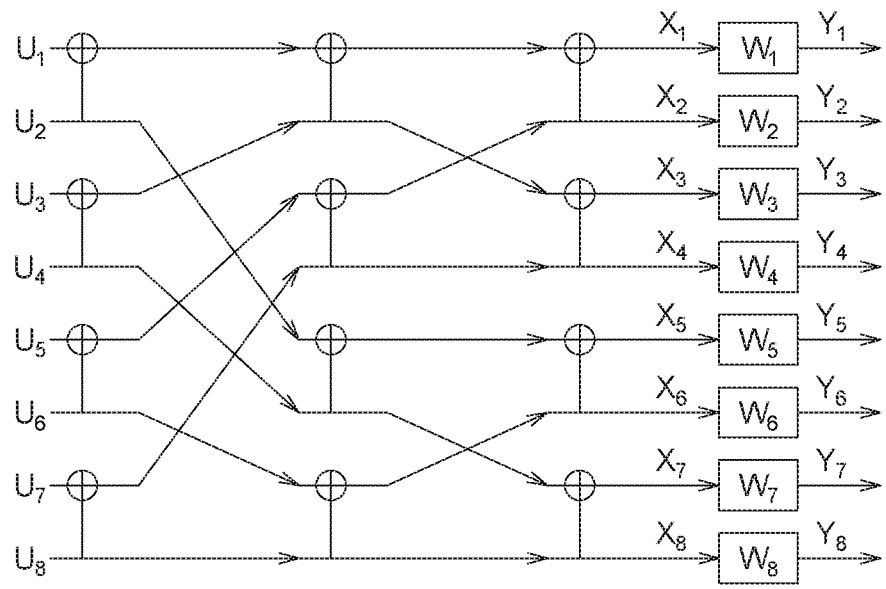
FIG. 2A shows an example polar code transformation.
FIG. 2B shows a generator matrix of the polar code transformation shown in FIG. 2A.

FIG. 2A shows an example polar code transformation. FIG. 2B shows a generator matrix G of the polar code transformation shown in FIG. 2A. In this example, the code length N of the polar code is 8 (bits).

A set of input bits U ($U_1$-$U_8$) pass through the polar transformation from the left to the right to form the code word X ($X_1$-$X_8$). The code word X is then written to a set of cells W ($W_1$-$W_8$). The output of the cells W ($W_1$-$W_8$) is represented as Y ($Y_1$-$Y_8$). Note that U and X are binary bits and Y is a binary/non-binary value when hard/soft information is considered. The generator matrix G is described as an N×N matrix (N=8 in this example), which transforms the input data U into the code word X=GU.

The i-th row of the generator matrix G indicates that which cell(s) the i-th input bit $U_i$ will be stored in. For example, according to the 3rd row of the generator matrix G, the input bit $U_3$ will be stored in the cells $W_1$ and $W_3$. The bit-channel seen by input bit $U_3$ is defined by the transformation between the input bit $U_3$ and the relating outputs $Y_1$ and $Y_3$ of the cells $W_1$ and $W_3$ (bit channel of $U_3$: $U_3 \rightarrow (Y_1, Y_3)$). Likewise, the bit-channel seen by input bit $U_4$ is defined by the transformation between the input bit $U_4$ and the relating outputs $Y_1$, $Y_3$, $Y_5$ and $Y_7$ (bit channel of $U_4$: $U_4 \rightarrow (Y_1, Y_3, Y_5, Y_7)$).

Typically, the cells $W_1$-$W_8$ are assumed to be i.i.d. Given a raw bit error rate (for example, 1%) for the memory cells $W_1$-$W_8$, the ranking of the bit-channels may be derived as [$U_8$, $U_7$, $U_6$, $U_5$, $U_4$, $U_3$, $U_2$, $U_1$] (the first ranking list R1), which is a sequence for U in reliable order. That is, the reliability of the bit-channels of the input bits $U_5$, $U_6$, $U_7$ and $U_8$ are better than that of the input bits $U_1$, $U_2$, $U_3$ and $U_4$. In such situation, consider the information length (data length K) is 4, the input bits $U_5$, $U_6$, $U_7$, $U_8$ are preferably selected as information bits and the input bits $U_1$, $U_2$, $U_3$, $U_4$ are preferably selected as frozen bits. The frozen bits may be set as 0 for example. The values of the frozen bits are known to the decoder beforehand.

Given a different raw bit error rate (for example, 5%) for the memory cells $W_1$-$W_8$, the ranking of the bit-channels may change to [$U_8$, $U_7$, $U_6$, $U_4$, $U_5$, $U_3$, $U_2$, $U_1$] (the second ranking list R2). Following the aforementioned example (data length K=4), $U_5$ now becomes a position for a frozen bit. The bit-channel $U_5$ may be referred as a "boundary bit-channel" because its position is near the boundary between a frozen bit and an information bit. Also, the position of the bit-channel $U_5$ changes under different raw bit error rate conditions.

Figure 3:
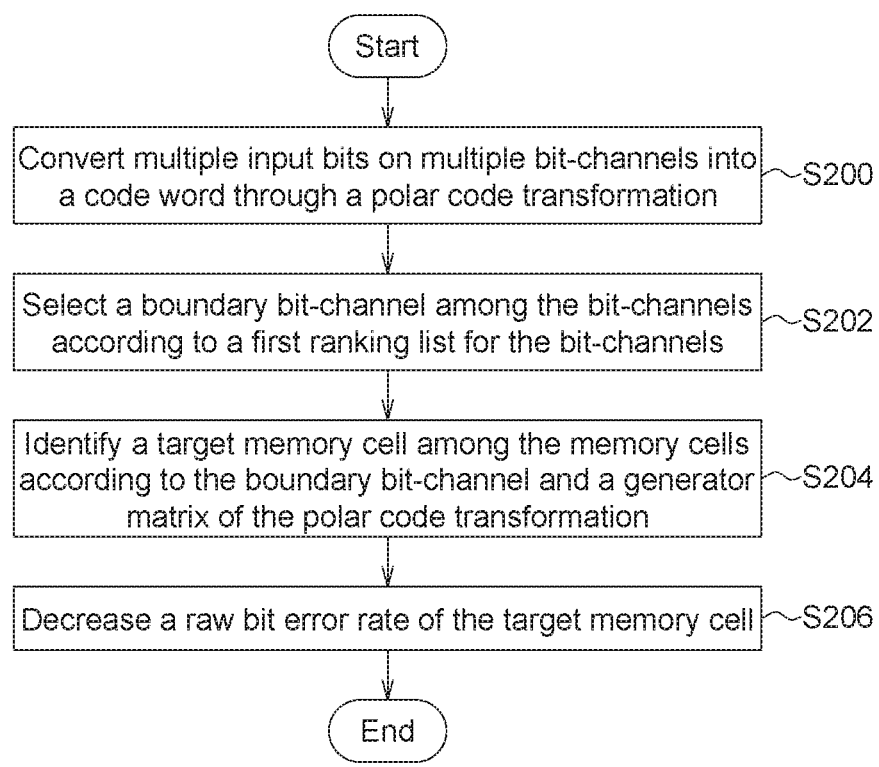
FIG. 3 is an example flow chart illustrating a control method for a memory device, in accordance with an embodiment of the present disclosure.

FIG. 3 is an example flow chart illustrating a control method for a memory device, in accordance with an embodiment of the present disclosure. Step S200 may be performed by the polar encoder 106 to convert multiple input bits on multiple bit-channels into a code word through a polar code transformation. Step S202 may be performed by the PCA unit 112. The PCA unit 112 selects the boundary bit-channel (in the above example, $U_5$) among the bit channels according to the first ranking list R1.

Then in step S204, the PCA unit 112 identifies one or more target memory cells among the memory cells in the memory device 102 according to the boundary bit-channel and a generator matrix G of the polar code transformation. According to the generator matrix G shown in FIG. 2B, the target cells corresponding to the bit-channel $U_5$ include $W_1$ and $W_2$. In step S206, the PCA unit 112 decreases the raw bit error rate for the target memory cells $W_1$ and $W_2$. As such, the reliability of the bit-channel $U_5$ increases such that the bit-channel $U_5$ becomes more reliable than the bit-channel $U_4$. Therefore the ranking of the bit-channels may be kept the same as $[U_8, U_7, U_6, U_5, U_4, U_3, U_2, U_1]$. In other words, the same first ranking list R1 may be used even under different memory usage conditions because the PCA unit 112 manages to control the wearing condition of certain target memory cells.

There may be several different implementations for the step S206. For example, there may be several noises source for the cells in the NAND flash memory. Decreasing such noise effectively decreases the raw bit error rate for the target memory cell. In one embodiment, the PCA unit 112 may reduce a number of program/erase (P/E) cycles applied to the target memory cell. In other embodiments, the PCA unit 112 may reduce cell-to-cell interference of the target memory cell, reduce program disturb/read disturb, or control data retention of the target memory cell. P/E cycle management will be used as an example in the following description.

One possible implementation for reducing the P/E cycles applied to the target memory cell having a corresponding logical address is: mapping the logical address of target memory cell to another physical memory region other than an original physical region of the target memory cell. As a result, a programming command to the same logical address is mapped to a different physical address, and consequently the P/E cycles applied to the target memory cell can be reduced.

Figure 4A:
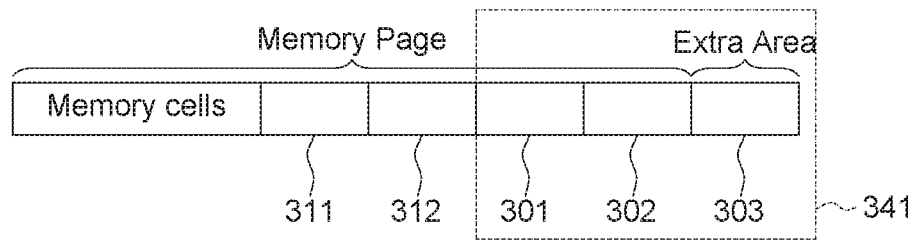
FIG. 4A shows an example memory cell arrangement in a basic round-robin approach, in accordance with an embodiment of the present disclosure.

In one embodiment, the step S206 may adopt a basic round-robin approach or an adaptive round-robin approach to reduce the P/E cycles applied to the target memory cell. The description of each approach will be given below. FIG. 4A shows an example memory cell arrangement in a basic round-robin approach, in accordance with an embodiment of the present disclosure. In this example the memory device 102 includes multiple memory pages, and one memory page is illustrated in FIG. 4A. The memory device 102 includes a memory page and an extra memory cell 303 that is not in the memory page. For example, the extra memory cell 303 may occupy extra area in addition to the ordinary normal memory pages. The memory page includes a first memory cell 311, a second memory cell 312, and the target memory cells 301 and 302.

Figure 5:
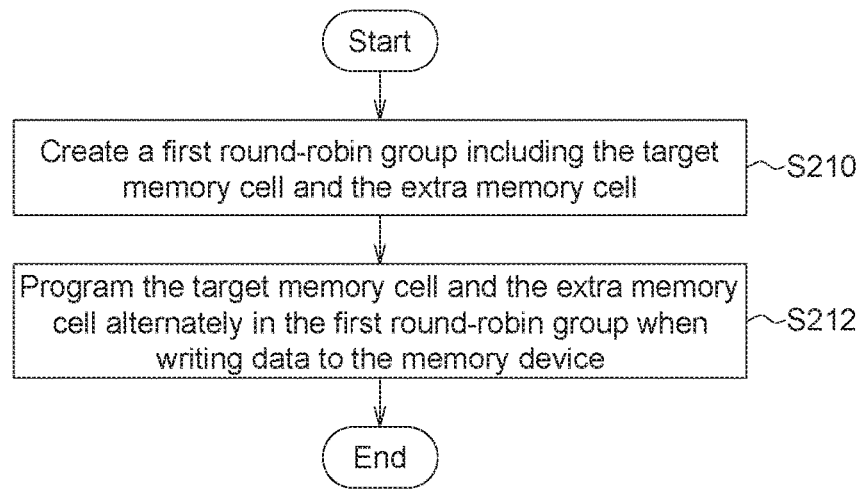
FIG. 5 is an example flow chart illustrating a basic round-robin approach, in accordance with an embodiment of the present disclosure.

FIG. 5 is an example flow chart illustrating a basic round-robin approach, in accordance with an embodiment of the present disclosure. Step S210: create a first round-robin group 341 including the target memory cells 301 and 302 and the extra memory cell 303. Step S202: Program the target memory cells 301 and 302 and the extra memory cell 303 alternately in the first round-robin group when writing data to the memory device 102. That is, after the PCA unit 112 identifies the target memory cells 301 and 302, the extra memory cell 303 is grouped with the target memory cells 301 and 302 to program in a round-robin manner.

Figure 4B:
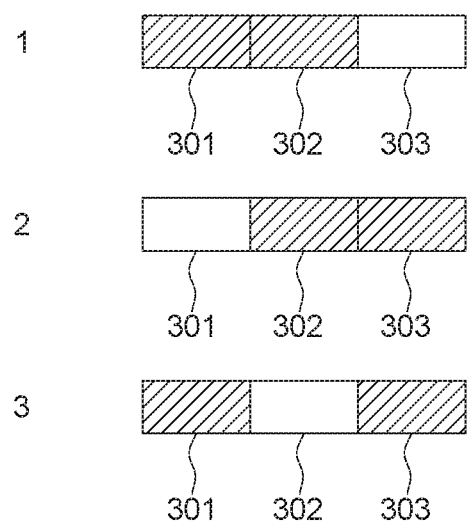
FIG. 4B shows an example of memory cells in the first round-robin group in successive P/E cycles, in accordance with an embodiment of the present disclosure.

FIG. 4B shows an example of memory cells in the first round-robin group in successive P/E cycles, in accordance with an embodiment of the present disclosure. In the first P/E cycle, data are programmed to the cells 301 and 302. In the second P/E cycle, data are programmed to the cells 302 and 303. In the third P/E cycle, data are programmed to the cells 301 and 303. As compared to the cell arrangement before creating the first round-robin group 341, the P/E cycles applied to the target memory cells 301 and 302 are reduced to about 67% of the original P/E cycles.

In this example the number of the target memory cells is two, but the number of the target memory cells may be other different numbers, depending on the number of cells corresponding to the boundary bit-channel. In addition, the number of boundary bit-channel is not limited to one. Also the number of extra memory cells to be grouped in the first round-robin group may also be more than one. The more the number of extra memory cells, the more the P/E cycle reduction can be achieved.

For example, if the boundary bit-channel includes $U_2$ and $U_3$, the target memory cells are cells $W_1$, $W_3$ and $W_5$ according to the generator matrix G shown in FIG. 2B. The step S210 in FIG. 5 may create the first round-robin group including the target memory cells $W_1$, $W_3$ and $W_5$ and two extra memory cells, such that the P/E cycles applied to the target memory cells are reduced to about 60% of the original P/E cycles.

Figure 6:
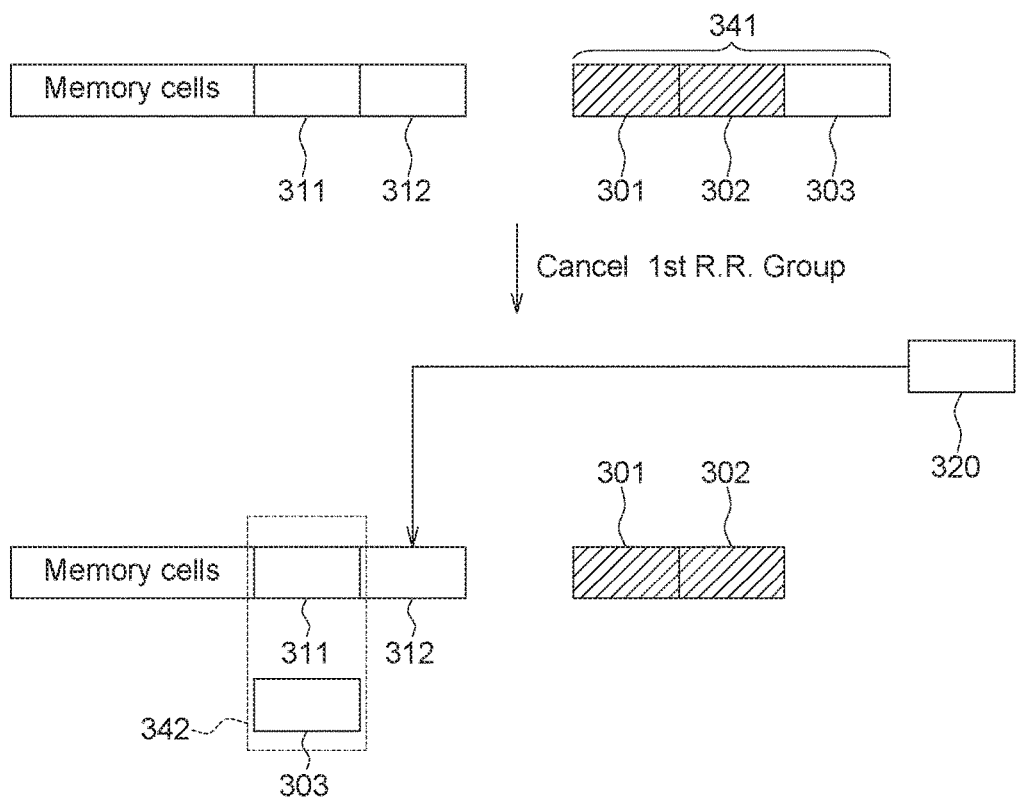
FIG. 6 shows an example memory cell arrangement in an adaptive round-robin approach, in accordance with an embodiment of the present disclosure.

FIG. 6 shows an example memory cell arrangement in an adaptive round-robin approach, in accordance with an embodiment of the present disclosure. As shown in FIG. 6, after a certain number of P/E cycles, the first memory cell 311 and the second memory cell 312 become "old" (severe wearing). In one embodiment, a second round-robin group may be created to incorporate the first memory cell 311 or the second memory cell 312 in order to mitigate the wearing of these "old" cells.

Figure 7:
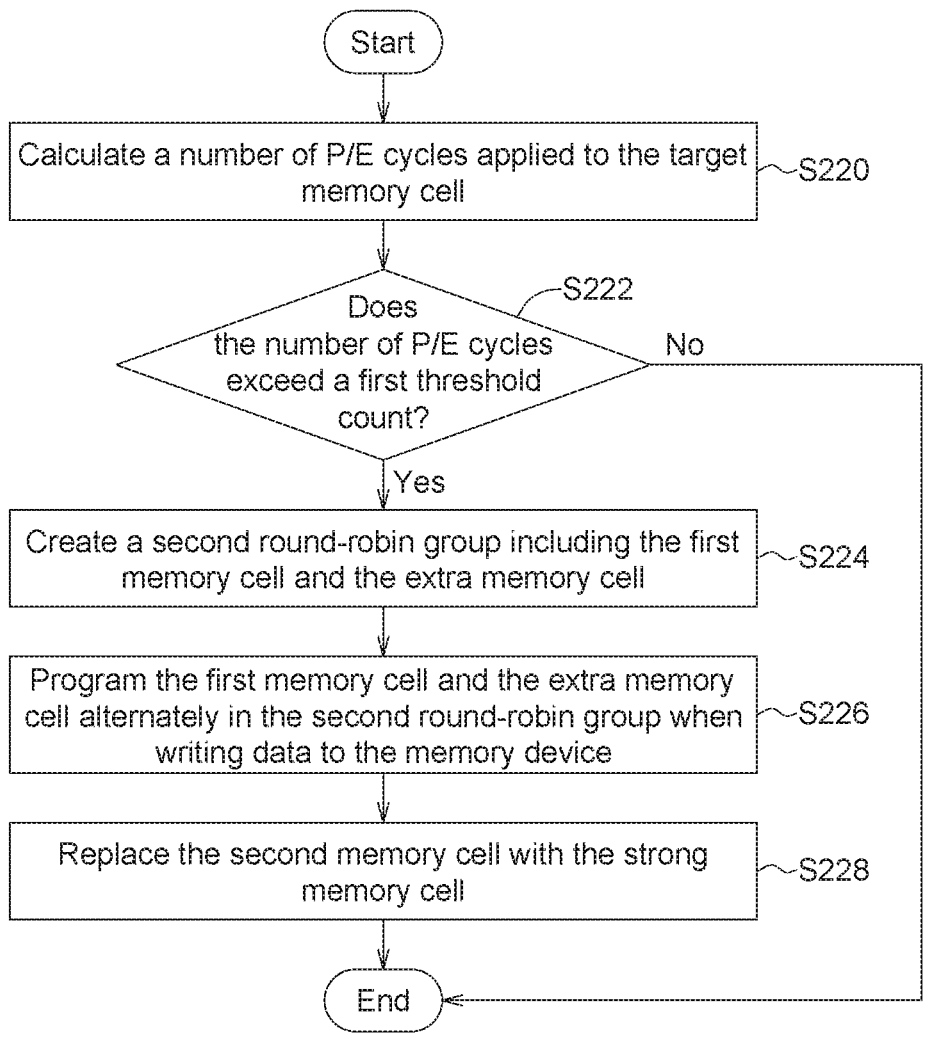
FIG. 7 is an example flow chart illustrating an adaptive round-robin approach, in accordance with an embodiment of the present disclosure.

FIG. 7 is an example flow chart illustrating an adaptive round-robin approach, in accordance with an embodiment of the present disclosure. Step S220: Calculate a number of P/E cycles applied to the target memory cell. Step S222: Determine whether the number of P/E cycles exceeds a first threshold count. The first threshold count may be a predetermined number, such as 1000 or 10000. If the determination result of the step S222 is yes, there may be some memory cells aging too much, then the procedure proceeds to step S224: create a second round-robin group 342 including the first memory cell 311 and the extra memory cell 303. In this case, the first memory cell 311 was not in the first round-robin group 341, and the extra memory cell 303 was in the first round-robin group 341. The number of P/E cycles applied to the first memory cell 311 is larger than the number of P/E cycles applied to the extra memory cell 303. Step S226: Program the first memory cell 311 and the extra memory cell 303 alternately in the second round-robin group 342 when writing data to the memory device 102. By creating the second round-robin group, the raw bit error rate of a memory cell that was not in the first round-robin group may be reduced to enhance the memory quality.

In one embodiment, the method shown in FIG. 7 may include the step S228: Replace the second memory cell 312 with a strong memory cell 320. The step S228 may be optionally performed. The strong memory cell 320 may be a cell that has not been programmed yet, and thus the strong memory cell 320 is relatively "new" to other memory cells. On the other hand, the second memory cell 312 has been programmed many times. In this embodiment, the second memory cell 312 may be replaced with the strong memory cell 320 to prevent further deterioration of the second memory cell 312. In one embodiment, the strong memory cell 320 may be a new cell that has not been used. In other words, the number of P/E cycles applied to the strong memory cell 320 is zero.

Figure 8:
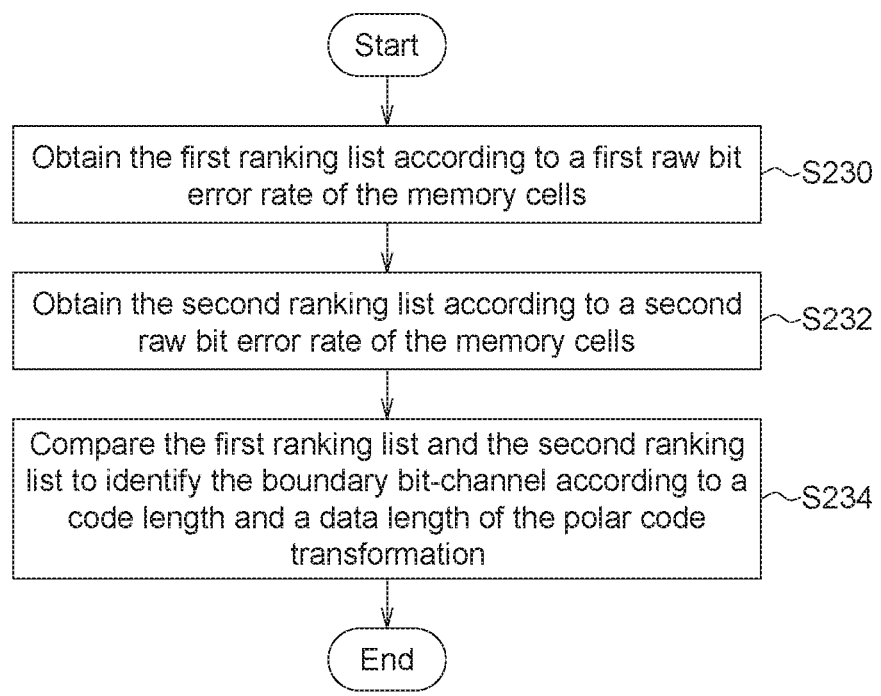
FIG. 8 is an example flow chart illustrating a method for selecting the boundary bit-channel, in accordance with an embodiment of the present disclosure.

In one embodiment, some analysis may be performed to find out the boundary bit-channel(s) of the given polar code transformation. FIG. 8 is an example flow chart illustrating a method for selecting the boundary bit-channel, in accordance with an embodiment of the present disclosure. Step S230: Obtain the first ranking list R1 according to a first raw bit error data rate of the memory cells. For example, the first raw bit error rate is 1%. Alternatively, the first ranking list R1 may correspond to a first range of P/E cycles (e.g., 0-10000). S232: Obtain the second ranking list R2 according to a second raw bit error data rate of the memory cells. For example, the second raw bit error rate is 5%. Alternatively, the second ranking list R2 may correspond to a second range of P/E cycles (e.g., 10001-20000). S234: Compare the first ranking list R1 and the second ranking list R2 to identify the boundary bit-channel according to a code length N and a data length K of the polar code transformation. For example, the code length N is 8, the data length K is 4, then the boundary bit-channels may include the cells corresponding to the fourth position and the fifth position in the first ranking list R1 and the second ranking list R2.

In one embodiment, the boundary bit-channel is an information bit (ranked in the first K positions) in the first ranking list R1, and is a frozen bit (not ranked in the first K positions) in the second ranking list R2. In order to keep using the first ranking list R1 under different cell wearing conditions, the proposed control method decreases the raw bit error rate of the target memory cells corresponding to the boundary bit-channel (step S206 in FIG. 3).

The code length is 8 and the data length K is 4 in the previous example. The proposed control method may also be applied to polar code transformation with larger code length. Taking a 32-bit polar code with 23 information bits and 9 frozen bits as an example (N=32, K=23), the first ranking list R1 corresponding to the raw bit error rate 0.001 may be [$U_{31}$, $U_{30}$, $U_{29}$, $U_{23}$, $U_{27}$, $U_{15}$, $U_{28}$, $U_{26}$, $U_{25}$, $U_{22}$, $U_{21}$, $U_{14}$, $U_{19}$, $U_{13}$, $U_{11}$, $U_7$, $U_{24}$, $U_{20}$, $U_{18}$, $U_{12}$, $U_{17}$, $U_{10}$, $U_9$, $U_6$, $U_5$, $U_3$, $U_{16}$, $U_8$, $U_4$, $U_2$, $U_1$, $U_0$], and the second ranking list R2 corresponding to the raw bit error rate 0.01 may be [$U_{31}$, $U_{30}$, $U_{29}$, $U_{23}$, $U_{27}$, $U_{15}$, $U_{28}$, $U_{26}$, $U_{25}$, $U_{22}$, $U_{21}$, $U_{14}$, $U_{19}$, $U_{13}$, $U_{11}$, $U_7$, $U_{24}$, $U_{20}$, $U_{18}$, $U_{12}$, $U_{17}$, $U_{10}$, $U_6$, $U_9$, $U_5$, $U_3$, $U_{16}$, $U_8$, $U_4$, $U_2$, $U_1$, $U_0$].

If the first ranking list R1 is the desired fixed ranking list for all possible wearing conditions, the boundary bit-channel $U_9$ may be identified according to the first ranking list R1 and the second ranking list R2 (the bit-channel $U_9$ and the bit-channel $U_6$ change place near the information bit/frozen bit boundary in these two ranking lists). The step S202 selects the boundary bit-channel $U_9$, and the step S204 identifies the target memory cell(s) corresponding to the boundary bit-channel $U_9$. The PCA unit 112 then decreases the raw bit error rate of the target memory cell in the step S206 to increase the reliability of the boundary bit-channel $U_9$.

According to the embodiments given above, the proposed control method and the memory controller are able to select a boundary bit-channel and then decrease the raw bit error rate of the memory cell(s) corresponding to the boundary bit-channel, such that a single ranking list is sufficient for different cell wearing conditions. The method for decreasing the raw bit error rate may include reducing the number of P/E cycles. A basic round-robin or an adaptive round-robin approach may be adopted to reduce the number of P/E cycles applied to the target memory cell, such that the reliability of the boundary bit-channel can be enhanced.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A control method for a memory device, the control method comprising:
 converting, by a polar encoder, a plurality of input bits on a plurality of bit-channels into a code word through a polar code transformation, wherein the code word is written to a plurality of memory cells in the memory device;
 selecting, by a proactive channel adjustment unit, a boundary bit-channel among the plurality of bit-channels according to a first ranking list for the plurality of bit-channels provided by a ranking unit;
 identifying, by the proactive channel adjustment unit, a target memory cell among the plurality of memory cells according to the boundary bit-channel and a generator matrix of the polar code transformation; and
 decreasing, by the proactive channel adjustment unit, a raw bit error rate of the target memory cell;
 wherein the step of decreasing the raw bit error rate of the target memory cell comprises:
 reducing, by the proactive channel adjustment unit, a number of program/erase (P/E) cycles applied to the target memory cell.

2. The control method according to claim 1, wherein the target memory cell has a corresponding logical address, the step of reducing the number of P/E cycles applied to the target memory cell comprises:
 mapping, by the proactive channel adjustment unit, the logical address of the target cell to another physical memory region other than an original physical region of the target memory cell.

3. The control method according to claim 1, wherein the memory device comprises a memory page and an extra memory cell, the memory page comprises a first memory cell, a second memory cell, and the target memory cell, and the step of reducing the number of P/E cycles applied to the target memory cell comprises:
 creating, by the proactive channel adjustment unit, a first round-robin group comprising the target memory cell and the extra memory cell; and
 programming, by the proactive channel adjustment unit, the target memory cell and the extra memory cell alternately in the first round-robin group when writing data to the memory device.

4. The control method according to claim 3, wherein the step of reducing the number of P/E cycles applied to the target memory cell further comprises:
 calculating, by the proactive channel adjustment unit, the number of P/E cycles applied to the target memory cell;
 creating, by the proactive channel adjustment unit, a second round-robin group comprising the first memory cell and the extra memory cell when the number of P/E cycles applied to the target memory cell exceeds a threshold count; and
 programming, by the proactive channel adjustment unit, the first memory cell and the extra memory cell alternately in the second round-robin group when writing data to the memory device.

5. The control method according to claim 4, wherein the memory device further comprises a strong memory cell, and the step of reducing the number of P/E cycles applied to the target memory cell further comprises:

provided, by the proactive channel adjustment unit, the second memory cell with the strong memory cell when the number of P/E cycles applied to the target memory cell exceeds the first threshold count.

6. The control method according to claim 5, wherein the number of P/E cycles applied to the strong memory cell is zero.

7. The control method according to claim 1, wherein the step of decreasing the raw bit error rate of the target memory cell comprises:

reducing, by the proactive channel adjustment unit, cell-to-cell interference of the target memory cell.

8. The control method according to claim 1, further comprising:

obtaining, by the proactive channel adjustment unit, the first ranking list according to a first raw bit error rate of the plurality of memory cells;

obtaining, by the proactive channel adjustment unit, a second ranking list according to a second raw bit error rate of the plurality of memory cells; and comparing, by the proactive channel adjustment unit, the first ranking list with the second ranking list to identify the boundary bit-channel according to a code length and a data length of the polar code transformation.

9. The control method according to claim 8, wherein the boundary bit-channel is an information bit in the first ranking list, and is a frozen bit in the second ranking list.

10. A memory controller for controlling a memory device, the memory controller comprising:

a polar encoder, configured to convert a plurality of input bits on a plurality of bit-channels into a code word through a polar code transformation, wherein the code word is written to a plurality of memory cells in the memory device;

a ranking unit, configured to provide a first ranking list for the plurality of bit-channels; and a proactive channel adjustment unit, configured to select a boundary bit-channel among the plurality of bit-channels according to the first ranking list, identify a target memory cell among the plurality of memory cells according to the boundary bit-channel and a generator matrix of the polar code transformation, and decrease a raw bit error rate of the target memory cell;

wherein the proactive channel adjustment unit is configured to reduce a number of P/E cycles applied to the target memory cell.

11. The memory controller according to claim 10, wherein the target memory cell has a corresponding logical address, and the proactive channel adjustment unit is configured to map the logical address of the target cell to another physical memory region other than an original physical region of the target memory cell.

12. The memory controller according to claim 10, wherein the memory device comprises a memory page and an extra memory cell, the memory page comprises a first memory cell, a second memory cell, and the target memory cell, and the proactive channel adjustment unit is configured to create a first round-robin group comprising the target memory cell and the extra memory cell, and program the target memory cell and the extra memory cell alternately in the first round-robin group when writing data to the memory device.

13. The memory controller according to claim 12, wherein the proactive channel adjustment unit is configured to:

calculate the number of P/E cycles applied to the target memory cell;

create a second round-robin group comprising the first memory cell and the extra memory cell when the number of P/E cycles applied to the target memory cell exceeds a threshold count; and program the first memory cell and the extra memory cell alternately in the second round-robin group when writing data to the memory device.

14. The memory controller according to claim 13, wherein the memory device further comprises a strong memory cell, and the proactive channel adjustment unit is configured to replace the second memory cell with the strong memory cell when the number of P/E cycles applied to the target memory cell exceeds the first threshold count.

15. The memory controller according to claim 14, wherein the number of P/E cycles applied to the strong memory cell is zero.

16. The memory controller according to claim 10, wherein the proactive channel adjustment unit is configured to reduce cell-to-cell interference of the target memory cell.

17. The memory controller according to claim 10, wherein the proactive channel adjustment unit is configured to:

obtain the first ranking list according to a first raw bit error rate of the plurality of memory cells;

obtain a second ranking list according to a second raw bit error rate of the plurality of memory cells; and compare the first ranking list with the second ranking list to identify the boundary bit-channel according to a code length and a data length of the polar code transformation.

18. The memory controller according to claim 17, wherein the boundary bit-channel is an information bit in the first ranking list, and is a frozen bit in the second ranking list.

* * * * *